United States Patent [19]
Nagesh et al.

[11] Patent Number: 5,585,671
[45] Date of Patent: Dec. 17, 1996

[54] RELIABLE LOW THERMAL RESISTANCE PACKAGE FOR HIGH POWER FLIP CLIP ICS

[76] Inventors: Voddarahalli K. Nagesh, 20276 Pinntage Pkwy., Cupertino, Calif. 95014; Kim H. Chen, 852 Beaver Ct., Fremont, Calif. 94539; Cheng-Cheng Chang, 3365 St. Michael St., Palo Alto, Calif. 94306; Bahram Afshari, P.O. Box 8664, Stanford, Calif. 94309; Jacques Leibovitz, 1536 Larkspur Dr., San Jose, Calif. 95125

[21] Appl. No.: 319,764

[22] Filed: Oct. 7, 1994

[51] Int. Cl.$^6$ .............................. H01L 23/10; H01L 23/34
[52] U.S. Cl. .................... 257/697; 257/710; 257/713; 257/729; 257/778; 257/783
[58] Field of Search ..................... 257/683, 697, 257/693, 700, 703, 704, 705, 706, 707, 712, 713, 719, 778, 717, 710, 729, 782, 783

[56] References Cited

U.S. PATENT DOCUMENTS

| | | | |
|---|---|---|---|
| 5,126,829 | 6/1992 | Daikoku et al. | 257/713 |
| 5,175,613 | 12/1992 | Barker, III et al. | 257/713 |
| 5,276,586 | 1/1994 | Hatsuda et al. | 257/707 |
| 5,329,160 | 7/1994 | Miura et al. | 257/704 |

FOREIGN PATENT DOCUMENTS 0530758  3/1993  European Pat. Off. ............... 257/778

*Primary Examiner*—Rolf Hille
*Assistant Examiner*—Peter Toby Brown

[57] ABSTRACT

A flip-chip IC package (10) provides a thermally-conductive lid (20) attached to a backside of the chip (12) by a die attach layer (18) of a predetermined thickness range. A rim (22), preferably KOVAR iron-nickel alloy, is formed on the lid (20) with a depth (44) less than a sum (42) of a thickness of the chip, the interconnects (16), and a minimum final thickness (40) of the die attach layer (18) by a predetermined margin (46). An initial thickness of thermally-filled epoxy is applied to the backside of the chip and a layer of lid attach epoxy (24) is applied to the rim of the lid in a thickness sufficient to span the predetermined margin. The lid is floated on the die attach layer (18) with the rim of the lid surrounding the chip and floating on the lid attach material. The lid is clamped against the chip with a force sufficient to compress the die attach material to a predetermined thickness in a range less than the initial thickness and not less than the minimum final thickness (40). An oxide layer, such as an iron or iron-alloy oxide layer, is formed on the bottom surface of the rim. A spacer is placed on the backside of the chip within the die attach material (18), to define the minimum final thickness (40) of the die attach layer. A beveled or stepped vent hole is formed in the lid and plugged and sealed.

9 Claims, 7 Drawing Sheets

RELIABLE LOW THERMAL RESISTANCE PACKAGE FOR HIGH POWER FLIP CLIP ICS

BACKGROUND OF THE INVENTION

This invention relates to integrated circuit (IC) chip packaging techniques and more particularly to an improved process for packaging flip chip ICs so as to provide a reliable, low thermal resistance enclosure.

High performance processor ICs tend to have a very high input/output (IO) count. Hence, use of area array pads and "flip chip" interconnects becomes a necessity. Flip chip interconnections are used for IC chips having a number of I/O pads too large to be arranged along the chip edges. Instead, the I/O pads are arranged in an array on the chip. Such array precludes connection to the I/O pads by wire bonding or tape automated bonding. Instead, solder bumps are formed on the pads, and the chip is inverted (flipped over) and the I/O pads are soldered to a matching array on a substrate with multi-layer routing, by reflowing the solder bumps. Thus, the chip backside is exposed on top of the subassembly. The space around the electrical connections between the chip and the substrate is typically filled with an insulating resin, called the underfill, to increase the life of the connections.

This construction causes complications, however, in providing a suitable thermal solution, as compared with traditional wire bond interconnection techniques in which the backside of the die or chip is typically connected to a heat spreader. In the case of flip chip interconnects, the thermal spreader also has to be used as a protective lid, requiring attachment of the lid to a substrate at the same time that the thermal interface between the chip and the spreader is formed.

Furthermore, the high performance of state of the art chips, such as ULSI microprocessor ICs, also requires high thermal dissipation (typically in excess of 25 watts). Cooling of such chips when installed and operating, is typically done by air cooling, or by liquid cooling. In the latter case, the liquid cooling subsystem must ordinarily be self-contained to be usable in a desktop workstation. To provide effective cooling to these ICs, an extended surface, or cooling device, needs to be attached to the thermal spreader attached to the back of the flip chip. Such devices can apply mechanical loads to the chip which can damage it.

Prior art packaging techniques strive to avoid exerting undue mechanical loads to the chip by providing the thermal spreader in the form of a lid which is attached to the chip backside and to the ceramic substrate. The lid has a rim which is sized to mechanically contact the opposing face of the surrounding substrate, to which the rim is attached, while providing a clearance between the lid and the chip backside. Sufficient die attach material is laid on the chip backside to fill the space between the chip and the lid. One problem with this approach is that the variation in the clearance between the chip and the lid ceiling is the sum of the variations in the lid depth, the chip thickness and the height of the solder bumps. This variation in clearance, in turn, translates into a variation in thickness of the die attach material and therefore the thermal resistance of the die attach layer, thus rendering the thermal performance of such packaging uncertain.

For a successful thermal solution for high power flip chips, both thermal performance and reliability requirements need to be met. To meet thermal performance requirements, the lid is conventionally made of a high conductivity material. For reliability, it is desirable to have a hermetic or semi-hermetic seal enclosing the chip between the lid and surrounding substrate. One conventional technique is to use an aluminum lid mechanically contacting the surrounding substrate with a silicone adhesive seal. Another approach, typically used in military applications, requiring a hermetic seal is to form the lid of KOVAR iron-nickel alloy and brazing the rim of the lid onto the substrate surface. This approach is both difficult and expensive. Other packaging techniques have used epoxy to attach the lid rings to the substrate in low power, low cost applications.

In order to meet high thermal performance and reliability requirements, a packaging technique must be able to handle high thermal dissipation, typically in excess of 40 watts, preferably from 40 watts to as high as 60 watts (for an ambient temperature of 55° C. and junction temperature of 110° C.), which requires that the materials used for a packaging remain stable for long durations at elevated temperatures.

None of the prior art techniques for packaging flip chip integrated circuits meets the foregoing combination of requirements. Accordingly, a need remains for a flip chip IC packaging technique that provides low thermal resistance, consistency in fabrication and reliability in operation at a reasonable cost.

SUMMARY OF THE INVENTION

The invention is an improved flip chip IC package and method of fabrication. An integrated circuit chip or die is mounted with its interconnect side facing the interface side of a substrate having input connections and output connections formed on the opposite side thereof. Electrical connections such as solder bumps interconnect electrical circuitry on the interface side of the chip to circuit leads on the interface side of the substrate. A lid, which serves as a thermal spreader, is connected to the backside of the IC chip by means of a die attach layer. The lid has a rim which is connected to the interface side of the substrate at a position spaced outward from the chip to enclose the chip and its electrical connections between the lid and the substrate.

In accordance with one aspect of the invention, the package lid is referenced to the backside of the chip rather than to the interface side of the substrate. In order to do this, the rim of the lid is formed with a height that is less than the combined thickness of the chip, together with its electrical interconnections to the substrate, and the thickness of the die attach layer. This approach leaves a small gap between the rim of the lid and the substrate which is sealed by a suitable adhesive material, such as epoxy.

A second aspect of the invention is that the die attach layer is formed in a uniform thickness of a high thermal conductivity adhesive. Uniformity of thickness of the die attach layer can be enhanced, particularly for larger dies, by introduction of a spacer of known thickness. In one embodiment, the spacer can be a flat lamina die-stamped of metal or formed of a thermally-conductive material, preferably in a radial shape such as the shape of a plus, a cross or a star. Alternatively, the spacer can be formed by spheres of metal or glass of predetermined diameter embedded in the die attach material.

A third aspect of the invention is the use of a lid material that is of sufficiently high thermal conductivity and has a thermal coefficient of expansion approximately matched to that of the substrate material and which has a rim-to-substrate surface seal that is both mechanically reliable and at least semi-hermetic. Preferably, the lid is made of copper tungsten having an annular KOVAR iron-nickel alloy ring brazed to one side thereof to form the rim of the lid. The hermetic seal could be obtained by plating the surfaces of the lid with nickel and optionally a thin layer of gold and brazing the ring to the ceramic substrate. Preferably, however, the KOVAR rim is connected to the ceramic substrate by means of an epoxy-based seal. In this case, for reliability under humidity conditions, an oxide layer is formed on the KOVAR iron-nickel alloy ring to provide a polarity surface opposite that of the epoxy-based seal. This technique provides a semi-hermetic seal within an order of magnitude of brazed hermetic seals.

A further feature of the invention is that a vent hole can be provided in the lid to prevent pressure build-up in the IC cavity that could create blow holes in the lid epoxy during curing. The vent hole maintains thermal interface integrity during subsequent thermal processes. Several different techniques can be used to seal the vent hole, which avoid problems observed in the prior art in both the formation and closure of vent holes. One approach is to form a vent hole of convenient size (for example, 30 mil or larger) with a beveled wall having its smaller diameter on the bottom side. The beveled vent hole is blocked by inserting into the hole a sphere having a diameter slightly larger than that of the bottom side vent hole opening, and filling the remainder of the vent hole around the sphere with an epoxy adhesive. A variation of this technique is to use a frustoconical plug, or a cylindrical-sided disk, sized to fit in a lower portion of the beveled vent hole, and sealed therein by an epoxy layer. As a variation on the beveled vent hole, the vent hole can be formed by two concentric cylindrical holes of different size, the smaller hole in the lower position so that it can be plugged by a drop-in disk of somewhat larger diameter bonded in the upper portion of the vent hole. Alternatively, the vent hole could be plugged by partially precuring a quantity of epoxy long enough that it will not run easily, and then sealing the vent hole with the partially precured epoxy.

The package architecture and fabrication process of the invention provide a number of advantages for a flip chip IC package. One advantage is high thermal performance and mechanical integrity due to the use of a highly conductive chip-to-lid thermal interface to dissipate high power and a lid material closely matched in terms of thermal coefficient of expansion to the substrate to minimize thermal stress. This kind of package can readily be used for large, complex, high-power integrated circuits such as microprocessors having three million transistors or more. Another advantage is a process that is reproducible with a very high consistency using conventional fabrication equipment. A further advantage is a reliable, yet moderate cost lid seal to protect the die interface material due to superior bonding of the lid material and lid adhesive.

The foregoing and other objects, features and advantages of the invention will become more readily apparent from the following detailed description which proceeds with reference to the accompanying drawings.

BRIEF DESCRIPTION OF THE DRAWINGS

FIG. 3 is a schematic diagram similar to FIG. 1, in which

DETAILED DESCRIPTION

Figure 1:
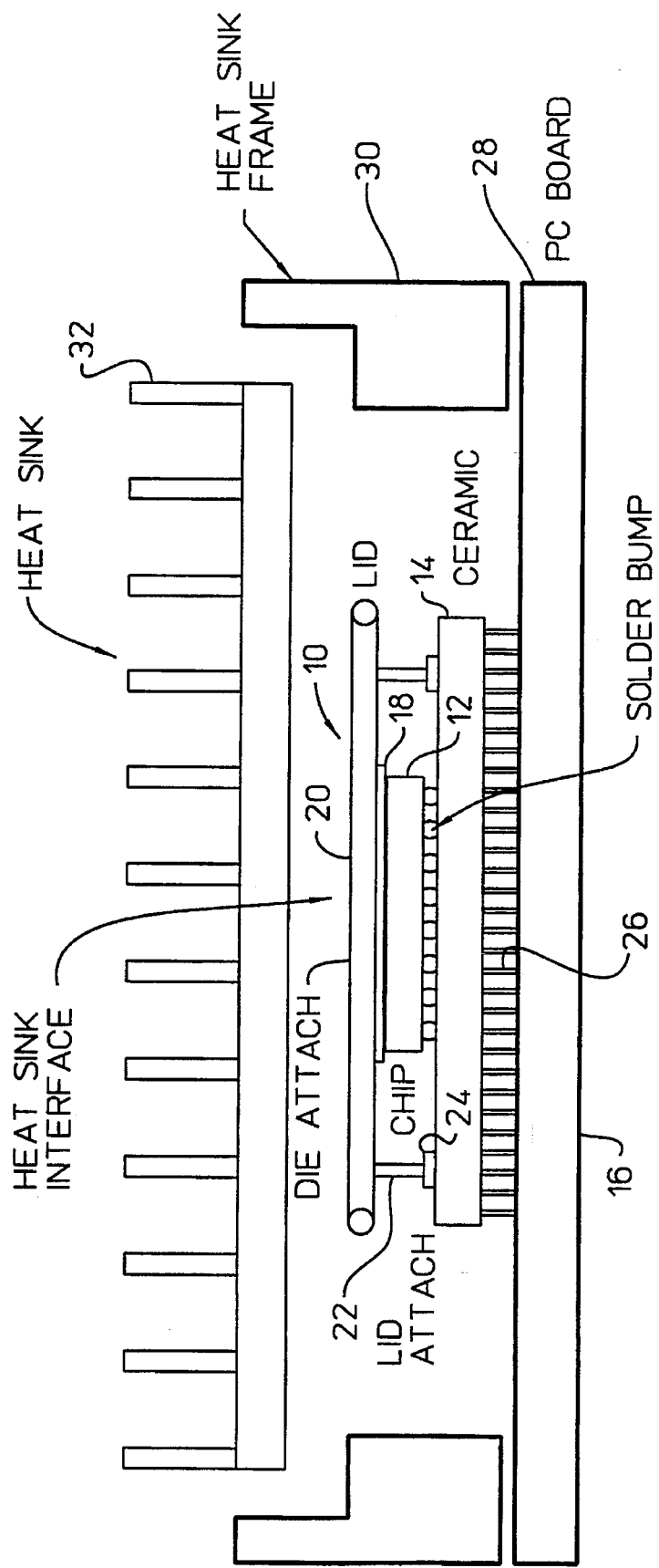
FIG. 1 is a schematic cross-sectional view of a flip chip package according to the invention mounted on a printed circuit board with a heat sink.
Figure 1A:
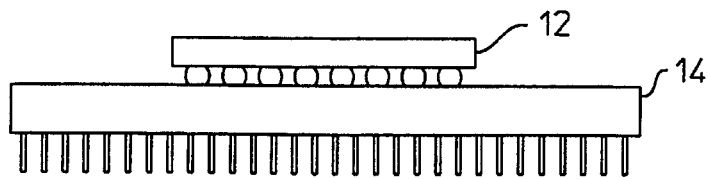
FIG. 1A is a view similar to FIG. 1 showing the flip chip subassembly prior to packaging.

Referring to FIGS. 1 and 1A, a flip chip IC package 10 according to the invention comprises an integrated circuit chip or die 12 mounted on a ceramic or other suitable substrate 14. Solder bumps or other suitable electrical connections 16 form interconnects between circuitry formed on the inverted interconnect side of the chip 12 and the upper or interface side of the substrate 14. The space around the electrical connections 16 between the chip 12 and substrate 14 is filled with a resin which is referred to as the underfill. This resin has thermomechanical properties which increase the life of the electrical connections, and is electrically insulative. This forms the flip chip subassembly shown in FIG. 1A.

In accordance with the invention, a lid 20 is connected to the chip by a die attach layer 18 sandwiched between the backside of the chip and the inner surface or ceiling of the lid. The lid, in turn, has a rim 22 surrounding the chip and connected to the upper surface of the substrate 14 by a lid attach layer 24.

Figure 2:
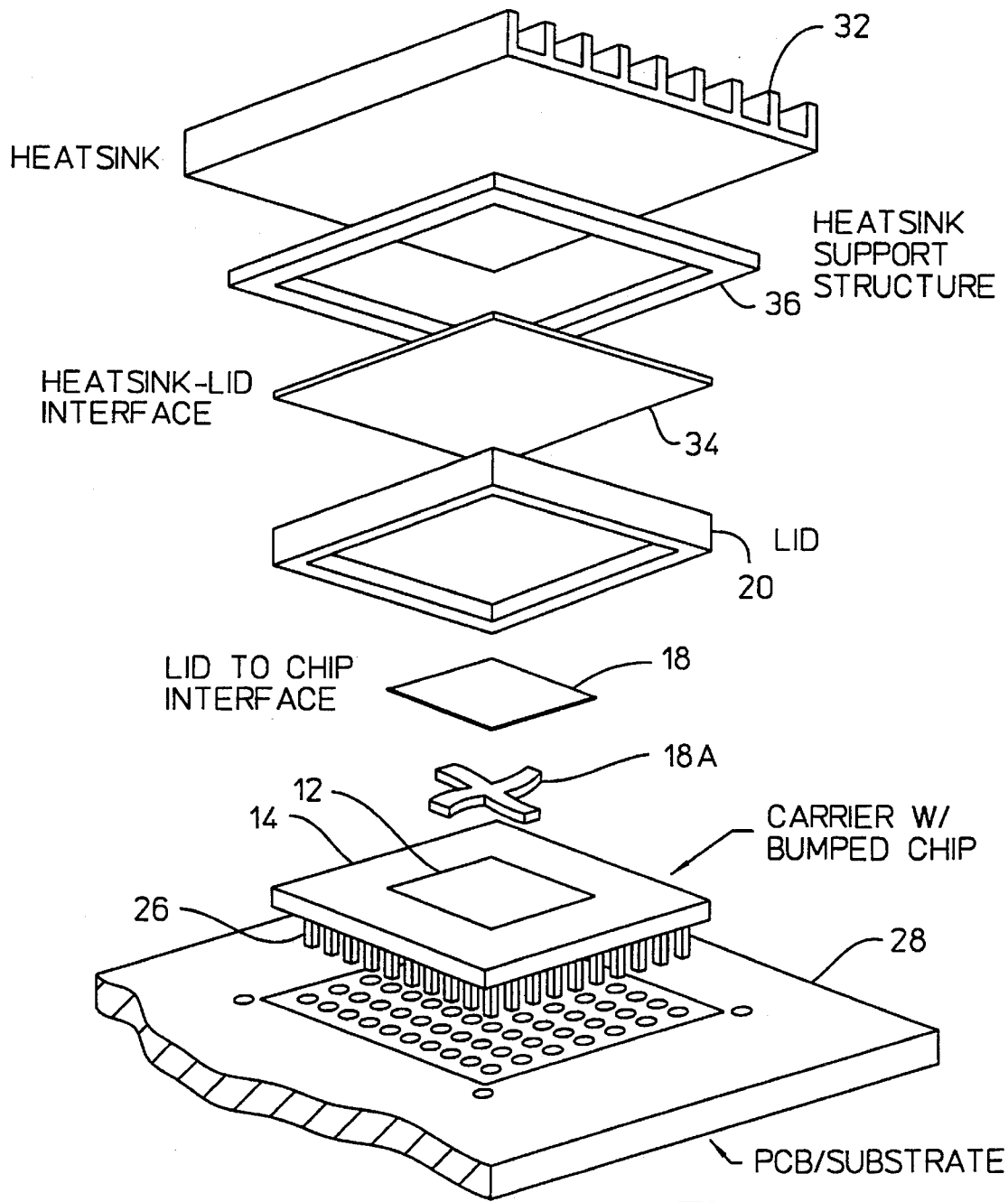
FIG. 2 an exploded perspective view showing the assembly of FIG. 1 in further detail.

In accordance with conventional practice, the substrate 14 has IO pins or other suitable electrical connections 26 coupling the package to a printed circuit board 28 or other suitable circuit assembly substrate. A heat sink frame 30 is mounted on the printed circuit board 28 to receive a heat sink 32. As shown in FIG. 2, a heat sink-lid interface layer 34 and heat sink support structure 36 can be used to provide a good thermal connection between the lid 20 and the heat sink 32. Also shown in FIG. 2, the lid chip backside interface can include a spacer 18A embedded in the die attach adhesive layer 18.

Figure 3:
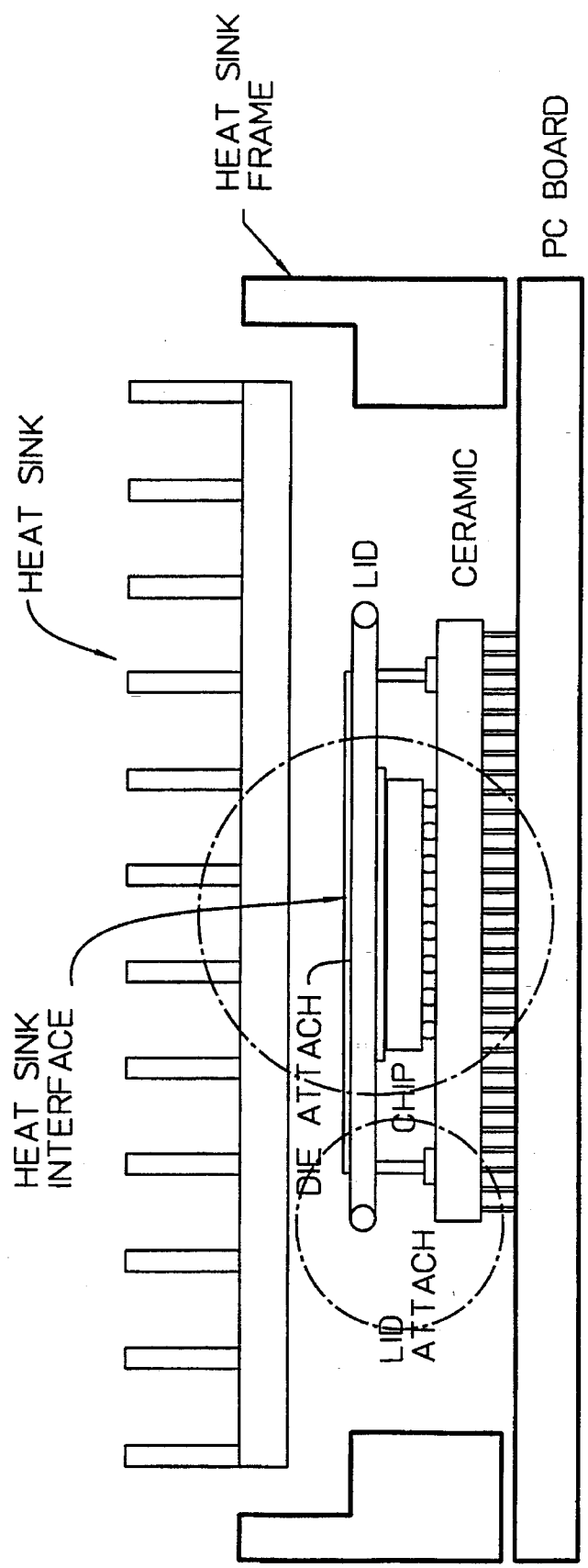
Figure 3A:
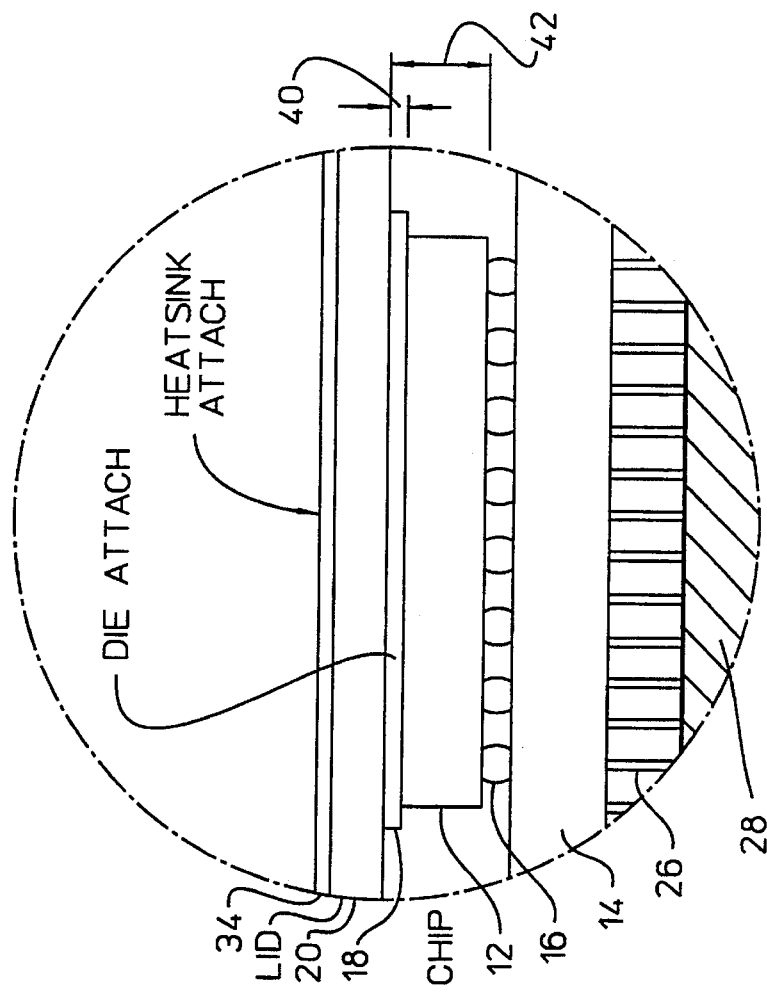
FIG. 3A shows the details of the controlled-thickness die attach layer in greater detail and FIG. 3B shows the floating lid attachment in further detail.

Referring to FIG. 3A, the die attach layer 18 has a predetermined thickness 40 selected to provide a low resistivity thermal connection between the backside of the chip 12 and the lid 20. Die attach layer thickness 40 is controlled in the fabrication process to provide substantial uniformity from one package to the next. This consistency is enhanced, particularly in dealing with larger size dies, by using a spacer 18A. Preferably, the spacer is formed by die-stamped metal layer having a plus-sign or cross shape or star shape of a known thickness (for example, 0.5 mils). The thickness of the metal spacer establishes a minimum thickness for die attach layer 18. The maximum thickness 40 is determined by the particular choice of material deposited and process conditions such as curing and loading conditions. Different types of spacers can also be used. For example, the spacers could be formed by a plurality of spheres of known diameter embedded in the die attach material. The spacer material is preferably a metal, because of its high thermal conductivity, but could be made of other suitable material such as glass beads. In tests using a die attach thickness 40 in the range of 0.5 mils, both with and without spacers, thermal resistance from junction to case measure less than 0.4° C. per watt, even after stress exposures during reliability tests. Under comparable circumstances, conventional packages without accurate die attach thickness control using chip-referencing cannot attain such a low junction-to-case thermal resistance consistently. While having a very small thickness of the die attach layer is ideal for thermal performance, too thin a layer is susceptible to high thermal stress during thermal cycling. This susceptibility is in part, a function of the size of the chip. For large dies, especially, it is important to have a controlled thickness of the thermal interface. The die attach material itself preferably has a thermal conductivity higher than 2W/M °C. The die attach material is preferably of an epoxy base that has a glass transition point lower than 125° C. (the lower the better) and can be either electrically conducting or nonconducting. A die attach thickness of 1.0 mil ±60% provides good thermal conductance for chips dissipating in the range of 40 to 60 watts. In the tests summarized above, the die attach material was an electrically conducting silver-filled epoxy-based material commercially available from Ablestik Company having a glass transition point of 85° C. A thermal grease can also be used. Thus, preferably, a low stress thermal interface can be used as the die attach layer 18, again with or without the spacers to aid in control of thickness 40.

Figure 3B:
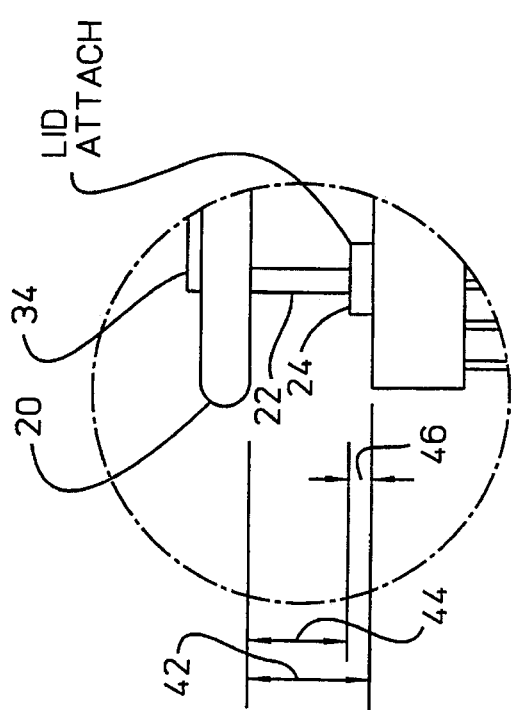

Having established thickness 40, the sum of thickness 40 and the thickness of the chip 12 and solder bumps 16 or other electrical connections to the substrate interface, sum to a total thickness 42. Referring to FIG. 3B, according to the present invention, the lid is referenced to the backside of the chip rather than to the substrate. Accordingly, the rim 22 of the lid is sized to a depth 44 less than dimension 42. The difference in these dimensions, denoted in FIG. 3B by clearance dimension or gap 46 is sized sufficiently large to accommodate a reasonable range of normal variation in a combined thickness of the chip, solder bumps and die attach layer. Accordingly, before curing the lid may be said to float on the chip and die attach layer. When sealed by a lid attach layer or material 24 of epoxy or silicone, as further described below; this approach avoids mechanically stressing the chip while helping maintain the controlled thickness 40 of the die attach layer 18.

The lid material and lid attach material are selected to meet several criteria. The lid material must be of sufficiently high thermal conductivity to pass heat from the chip and have a thermal coefficient of expansion matched with the substrate material (typically a ceramic like aluminum oxide). The lid material can be formed of aluminum silicon carbide, copper tungsten or even a ceramic such as aluminum nitride. A preferred material is copper tungsten. The lid attach material 24 can vary, depending on the types of materials being joined, and the degree of hermetic seal required.

Preferably, for the optimum combination of cost, reliability and near-hermetic sealing capabilities, organic bonding material (epoxy or silicone) is used in combination with a polar oxide surface on the rim 22 of the lid adjoining the surface of the ceramic substrate. An epoxy-based lid attachment layer has sufficiently high adhesion strength to the surrounding ceramic material. To obtain a nearly-hermetic seal with the lid, it is preferable for the lid to be formed of copper tungsten and to have a KOVAR iron-nickel alloy ring brazed thereon to form the rim. The KOVAR iron nickel alloy is an iron-nickel alloy containing a high percentage of iron. Like copper tungsten, KOVAR iron-nickel alloy has an excellent thermal coefficient-of-expansion match to the alumina ceramic substrate. Since the KOVAR iron-nickel alloy ring is brazed to the copper tungsten lid, it mechanically expands and contracts together with the lid material as well.

Thus, this structure gives a good overall match of thermal coefficient of expansion between the lid, the rim and the ceramic substrate.

In order to promote adhesion with the organic lid attach material, the KOVAR iron-nickel alloy ring surface joining the ceramic interface surface is roughened by machining and then oxidized to provide a layer of black iron oxide. The iron oxide provides a polarity at-its surface opposite to the polarity of the epoxy lid attach material. The KOVAR iron-nickel alloy, thus treated, has the proper chemical and mechanical bonding characteristics to have good adhesion with the organic lid attach material, and a near-hermetic seal.

Alternatively, a hermetic seal can be provided with a copper tungsten lid material without having an oxide layer by using solder or a braze material between the lid and ceramic substrate with a corresponding metal ring on the substrate surface for solder/braze wettability. This package will then be hermetically sealed.

Another lid material AlSiC, exhibits similar basic chemical and mechanical bonding characteristics. The material is formed by binding the SiC powder with molten aluminum. By properly combining the aluminum and SiC (typically in a 1:3 ratio by volume) good thermal conductivity and a low thermal coefficient of expansion can be obtained. A rough Surface due to the presence of SiC powder provides a surface microstructure for good mechanical bonding. The thin coating of aluminum oxide on the surface of the metal aluminum (due to oxidation from atmospheric air) forms a good chemical bond to the organic lid attach material.

The foregoing lid attach system, sealed by epoxy layer 24, compares very favorably with a brazed-type hermetic seal. It typically provides a diffusion rate of $H_2O$ vapor or moisture on the order of $10^{-8} cm^3$ per second. The standard for hermetic sealing is less than $10^{-8}$ $cm^3$ per second, so the foregoing sealing system provides a semi-hermetic seal that is approximately within an order of magnitude of a brazed hermetic seal.

In curing the epoxy die attach and lid attach layers, it is necessary either to control the pressure as well as temperature of curing the epoxy, or to provide a vent in the lid to permit escape of gases from the space in which the chip and its electrical interconnects are enclosed. Venting is accomplished by drilling a ten mil (e.g. 10 mil (250 micrometer)) hole in the lid, so that the vent hole later can be epoxy-plugged with room temperature curing. Drilling such a small hole can be difficult and expensive. To drill a larger vent hole is easy and less costly but plugging it with epoxy is difficult due to the runny nature of epoxy requiring multiple applications of epoxy and curing periods between applications which undesirably extends the process time.

Figure 4:
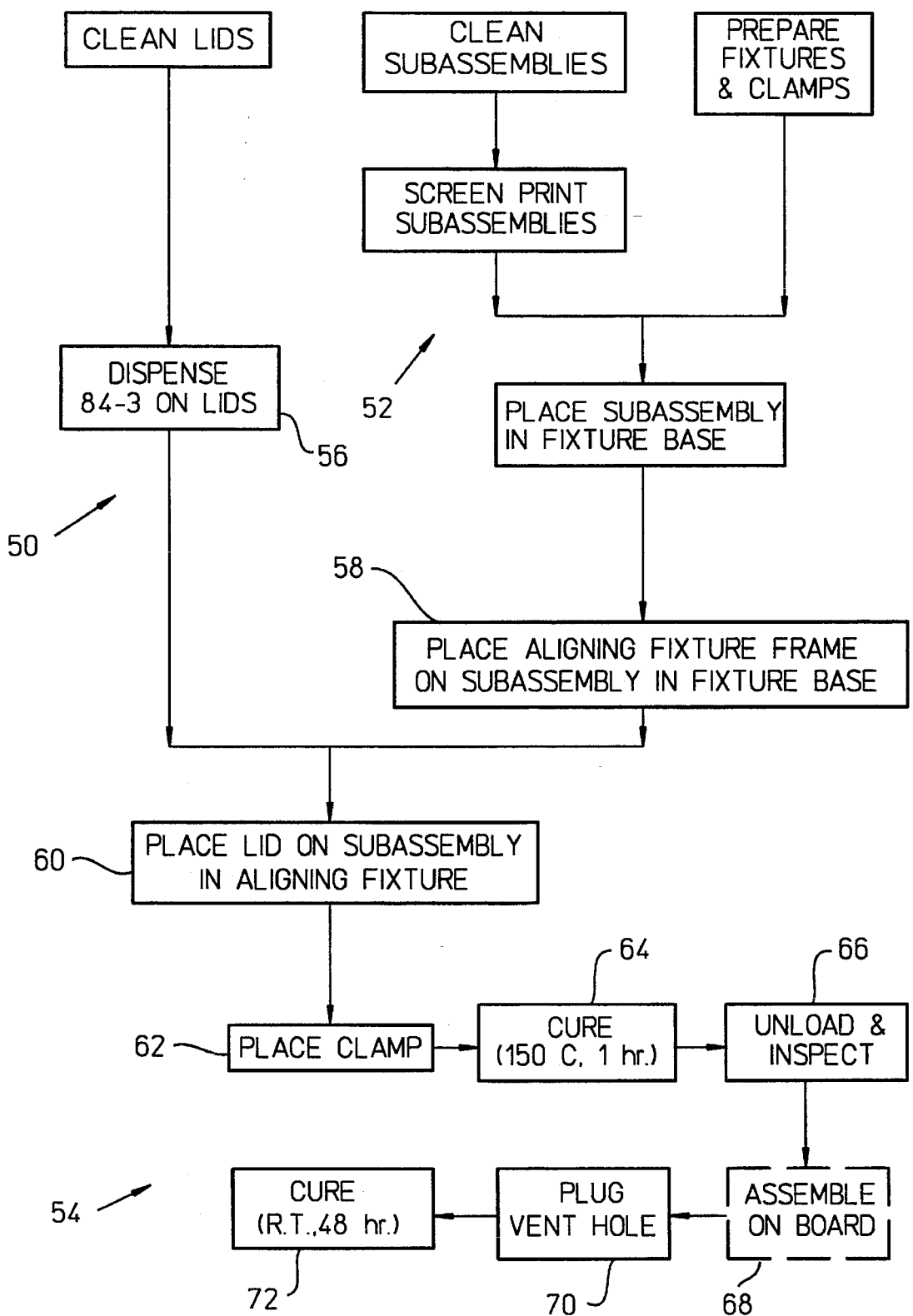
FIG. 4 is a process flow chart for the lid assembly-to-chip/substrate subassembly fabrication process of the present invention.

Referring to FIG. 4, much of the fabrication process, equipment and materials is conventional. Accordingly, these are only cursorily described, with those aspects of the process pertinent to the present invention being described in further detail. Also, there are two versions of this process, the second of which employs a spacer to establish die attach thickness, as mentioned above.

The overall process includes two main branches, which can be carried out either simultaneously, in parallel, or sequentially, depending on the availability of operators and equipment. The first processing pathway 50, to prepare the lid assembly, proceeds down the left side of FIG. 4. The second process pathway 52 proceeds down the right side of FIG. 4. Processing pathways 50, 52 culminate in a final assembly pathway 54 at the bottom of FIG. 4.

Referring to lid preparation pathway 50, the preferred form of lid is a copper tungsten lid 20 having a KOVAR iron-nickel alloy rim 22 defining a lid cavity. The vertical thickness of the rim 22 defines the depth 44 of the lid cavity as previously described. The rim 22 is sized to a depth 44 less than the total combined thickness 42 of the die thickness plus the interconnect and insulative organic underfill thickness plus the intended thickness of die attach layer 18, by an amount sufficient to provide a nominal gap having a width 46 greater than the range of variations in thickness of die 12 and solder bumps 16, for example, a gap of 5 mils to 4 mils (125 micrometers to 100 micrometers).

Preparatory to processing as shown in process pathway 50, the bottom surface of the rim 22 is mechanically roughened, in accordance with conventional practice. Then, according to the invention, an oxide layer is formed on the bottom surface of the rim 22. In the preferred case of a KOVAR iron-nickel alloy vent hole rim, this is done by various known processes such as thermally oxidizing the lid rim in air at 400° C. for one half hour or a hydrothermal process, etc. Also, a vent hole is formed in the lid as further described below with reference to FIGS. 5–9.

Once the lids have been oxidized, marked and cleaned, the lid attach organic adhesive 24 (preferably epoxy, Ablestik 84-3; or silicone, such as Dow-Corning Sylgard) is loaded in a conventional dispensing apparatus. The adhesive is dispensed onto the roughened oxidized bottom surface of the lid rim 22 in processing step 56 in an amount that is readily determined empirically.

Turning now to processing pathway 52, the initial application of die attach material 18 to the backside of chip 12 is carried out using conventional apparatus. The preferred die attach adhesive is a thermally-conductive epoxy or other organic adhesive, preferably Ablestik 965-1L, which is filled with a silver powder having a nominal particle size of about 0.4 mil (10 micrometer).

The die attach adhesive 965-1L is screen-printed onto the backside of die 12 using a conventional printer. We used the UNIVERSAL Model 1202 printer with a screen having a one to two mil (25–50 micrometer) thick emulsion. The thickness of the emulsion determines the thickness of the die attach epoxy layer 18 before attachment of the lid. Concluding process path 52, the subassembly comprising the die 12 mounted face down on the ceramic substrate 14 with insulated electrical interconnections 16, and having a layer 18 of die attach material on the backside of the die, is positioned in a supporting fixture base, and then aligned in step 58.

Next, shifting to the final assembly procedure 54, step 60 is placement of the lid on the subassembly in an aligning fixture. Since the rim 22 of the lid is sized to a length 44 less than the combined thickness 42 of the die 12, interconnects 16 and die attach 18, the lid floats atop the adhesive layer 18 while the lower edges of rim 22 float on the lid attach adhesive 24. In step 62, a clamp is placed atop the lid to press the lid down against the die/ceramic subassembly 12, 14, 16. The clamping mechanism is adjusted to apply a predetermined force for squeezing the epoxy patch 18 down to a thickness within an acceptable tolerance of a predetermined thickness, e.g., 1 mil plus or minus 0.6 mil (25 micrometer plus or minus 60%). The adjustments required to provide the predetermined force are determined experimentally for each clamping mechanism, die size and die attach material. The clamping step keeps the lid attached to the chip atop a die attach layer 18 having a nominal thickness 40 of 1 mil (25 micrometer) during curing. Meanwhile, rim 22 remains attached to the ceramic surface by a lid attach layer 18 of a nominal thickness 46 of 5 mils (125 micrometer).

The process then proceeds to a curing step, in which the packaged subassembly is cured at 150° C. for one hour in step 64. Then, the packaged subassembly is unloaded and inspected in step 66 and assembled on a printed circuit board in step 68. Next, in step 70, a vent hole in lid 20 is plugged, as further described below and the subassembly is further cured at room temperature for 48 hours, in step 72.

An alternative and preferred embodiment of the process modifies process pathway 52 in ways that both simplify it and make the calibration of thickness 40 of die attach layer 18 much more accurate. Instead of using a screen and printer and processing steps, the backside of the side is wetted with a thin layer of epoxy. Then a spacer 18A (FIG. 2)is centered on the backside of chip 12. Alternatively, the spacer can be wetted with a thin layer of epoxy and placed in the center of the backside of the chip, As mentioned above, the thickness of spacer 18A is selected to match the approximate minimum desired thickness of die attach material 18 (for example, 0.5 mil (12.5 micrometer), 1.0 mil (25 micrometers) or 1.5 mil (37.5 micrometers) in thickness). The spacer is preferably radial in shape: e.g., cross-shaped, plus-shaped star-shaped. The lateral dimensions of the spacer 18A are sized to slightly less than the length and width of die 12.

After placement of the spacer 18A, a conventional dispenser is used to dispense a predetermined volume of the filled epoxy onto the backside of the die, over and around spacer 18A. The volume of filled epoxy that is dispensed is preferably in the range of 150% to 400% of the intended final volume of die attach material sandwiched in space 40 between the area of the backside of the die 12 and lid 20. After placement of the spacer 18A and dispensing of die attach material 18, the die attach process pathway 52 proceeds to placement of the subassembly in a fixture base, and subsequent steps are carried out as in the first embodiment. When the clamp is placed in step 62, the excess die attach material is squeezed out over the edges of the die but is kept out of contact with the electrical interconnects 16 by the insulative underfill material between chip 12 and the ceramic substrate 14.

FIGS. 5–9 illustrate a number of variations in a basic technique according to the invention for forming a vent hole in lid 20 and closing the vent hole at step 70 in the packaging process of FIG. 4. A vent hole is needed when using epoxy or other heat treated attachment material in order to equalize pressures during curing. If no vent hole is used, it is necessary to control curing pressure as well as temperature to avoid having blow holes form in-the lid attach epoxy. In the prior art, the conventional approach is to form a small vent hole, typically 10 mil (250 micrometer) in diameter, and then fill it with epoxy. Such a small vent hole is difficult to drill accurately and, due to the runny nature of epoxy, a larger vent hole will not adequately retain the epoxy to be reliably sealed. The problem is even more difficult if the lid is made of a material that cannot be drilled; such material must be ground and grinding cannot be used to form a small enough vent hole to be closed by fluid epoxy.

In general, the improved method of forming and closing a vent hole in the packaging of an IC flip chip is initially to form a larger vent hole, with a lower or inner portion of the vent hole smaller than the upper or outer portion. The vent hole is then closed by insertion of a plug having an intermediate diameter and sealing the plug in place with the single application of a layer of epoxy.

Figure 5A:
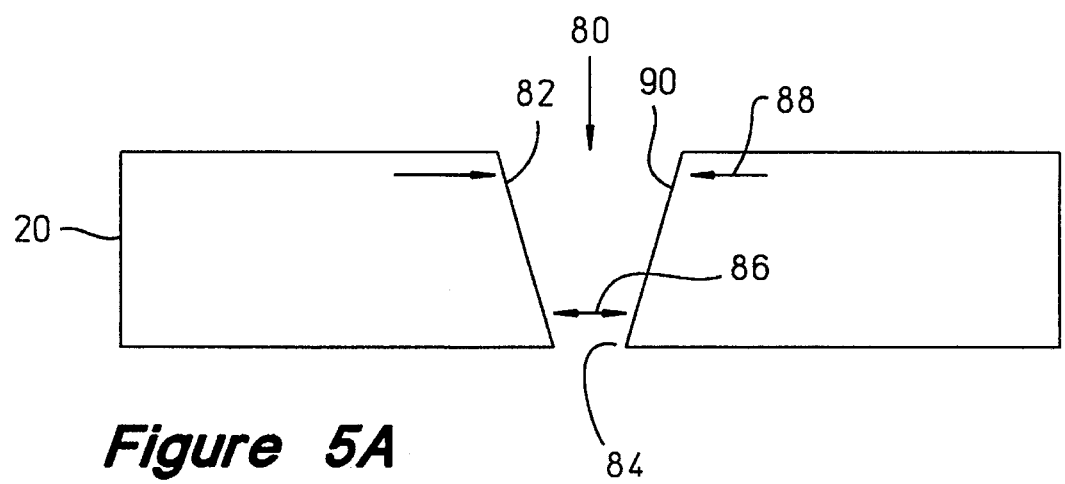
FIGS. 5A, 5B, 5C and 6–9 show various forms of oversized vent holes and plugging mechanism that can be used in the present invention.
Figure 5B:
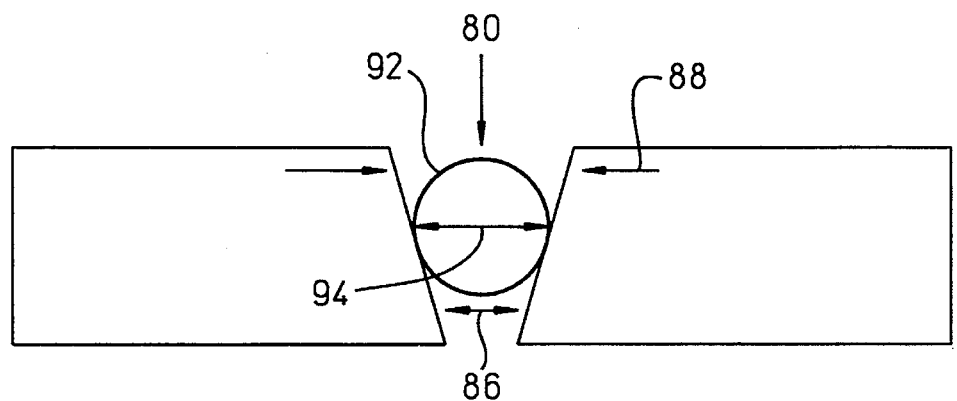
Figure 5C:
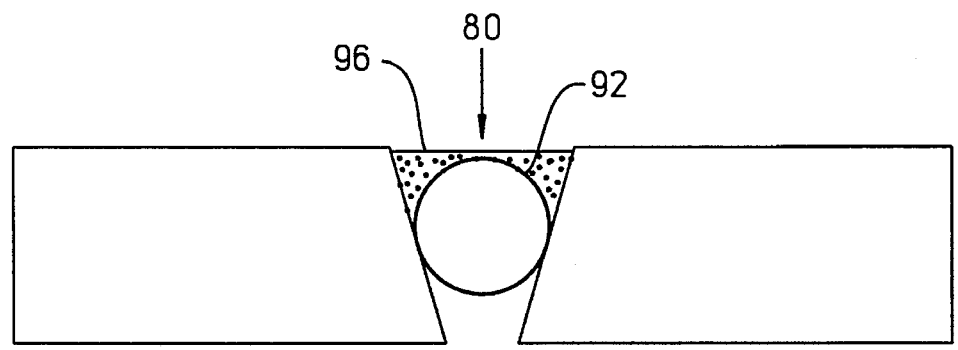

Referring to FIG. 5A, one way to implement the improved vent hole method is to form the vent hole with an inwardly tapered or beveled sidewall 82 to form an inner opening 84 having a diameter 86 less than the diameter 88 of the outer opening 90. Proceeding to FIG. 5B, this beveled opening 80 is closed by placing in it a generally spherical plug 92 of solder or other suitable material (e.g., hardened epoxy) having a diameter 94 approximately intermediate the diameters 86, 88. For example, the inner opening 84 can have a diameter 86 of 30 mils (0.75 mm.) and the plug diameter 94 can be 35 mils (0.875 mm.). Finally, epoxy 96 is flowed into the vent hole 80 around and over the plug 92, as shown in FIG. 5C, and retained therein by the plug. This epoxy is later hardened during the room temperature curing step 72.

Figure 6:
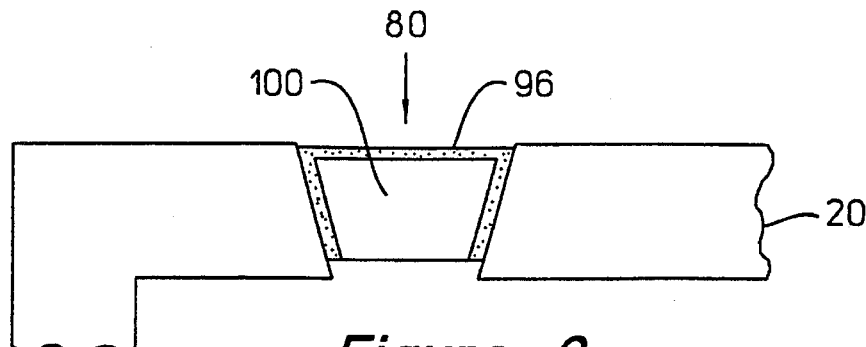
Figure 7:
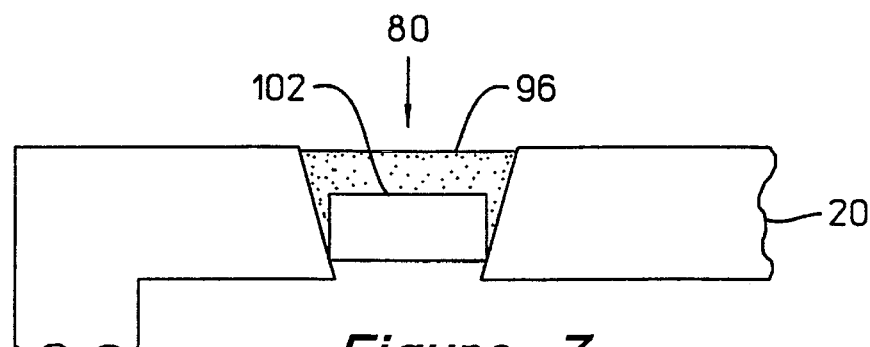

Referring to FIGS. 6 and 7, the vent hole 80 can alternatively be closed by a frustoconical plug 100, or by a disk-shaped plug 102. This approach is most useful if the lid is formed of AlSiC or other material in which the vent hole must be ground rather than drilled.

Figure 8:
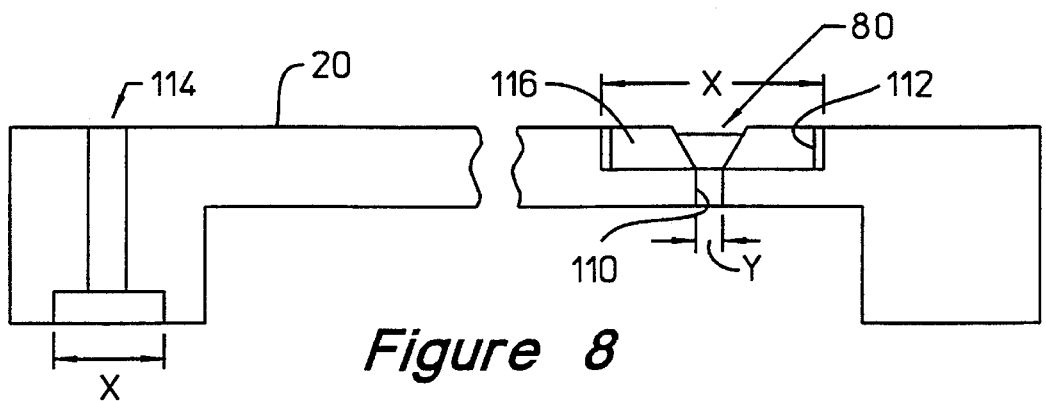
Figure 9:
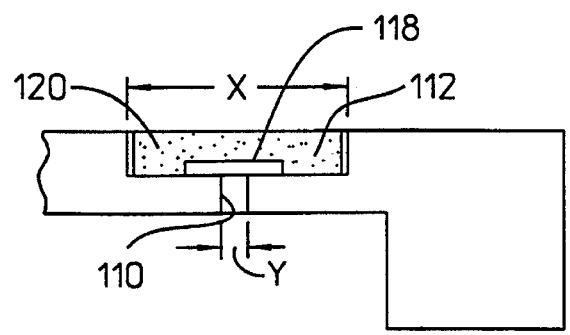

Another approach is shown in FIG. 8, in which the vent hole is drilled or ground with cylindrical openings of two diameters, the inner opening 110 having as small a diameter (Y) as can be easily formed and an outer opening 112 of a much larger diameter (X). These openings can be made the same size as stud holes 114 conventionally formed in the rim of an AlSiC lid, and during the same process step. Then, the opening 110 is partially plugged by brazing into lid opening 112 a disk 116 of slightly less than X diameter, formed of the same metal as conventionally used for studs. This material can readily be drilled to form an inwardly beveled vent hole 80, which is sized and closed as previously described and shown in FIGS. 5A–5C. A variation of this approach is shown in FIG. 9, in which a disk 118 having a diameter less than X but substantially greater than Y is placed in opening 112 over opening 110, and then opening 112 is filled with epoxy 120.

Another approach is to partially precure the epoxy 96 to make it more viscous so as to plug the large vent holes without using preformed plugs. In this approach a quantity of 84-3 epoxy is precured at 55° C. for 45 minutes, and is then placed in the vent hole to seal the hole. The final room temperature curing step 72 (FIG. 4) can be shortened accordingly.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. An integrated circuit chip package comprising:

an integrated circuit chip having an interconnect side and a backside;

a flip-chip substrate having a chip interface side and an input/output connection side, the chip being positioned with its interconnect side face-to-face against the connection side of the substrate;

an electrical connection between the chip and the substrate;

a lid having a rim depending therefrom to form a lid cavity enclosing the integrated circuit chip;

a die attach layer of a predetermined thickness sandwiched between the backside of the integrated circuit chip and the lid thermally interconnecting the integrated circuit chip and the lid; and a lid attach layer connecting the rim of the lid to the substrate;.

the rim of the lid having a dimension defining the depth of the lid cavity, that is less than the combined thickness of the integrated circuit chip, the electrical connection and die attach layer by a predetermined flap;

the lid attach layer closing said gap all around the chip, wherein the lid attach layer includes a polar organic material of a first polarity and the rim includes an oxide layer of a second polarity opposite the first polarity.

2. An integrated circuit chip package according to claim 1 in which the substrate includes a polar oxide layer of a second polarity opposite the first polarity.

3. An integrated circuit chip package according to claim 1 in which the lid rim is formed of an iron alloy having a thermal coefficient of expansion approximately matching a thermal coefficient of expansion of the substrate, the rim being oxidized to form the oxide layer of the second polarity.

4. An integrated circuit chip package according to claim 1 in which the lid attach layer comprises epoxy having a diffusion rate on the order of magnitude of $10^{-8}$ cm$^3$ per second.

5. An integrated circuit chip package according to claim 1 in which the thickness of the die attach layer is sufficiently thick to adhere the lid to the chip but thin enough to provide a sufficiently low resistivity thermal pathway to conduct heat away from the chip to the lid at least as fast as the heat is generated during operation of the integrated circuit.

6. An integrated circuit chip package according to claim 1 in which the die attach layer is an adhesive having a thickness selected from a first range of 1 mil plus or minus 60% and a second range of 25 micrometers plus or minus 60%.

7. An integrated circuit chip package according to claim 1 in which the die attach layer is a silver powder-filled epoxy material having a thickness selected from a first range of 0.4 mil to 1.6 mil and a second range of 10 to 40 micrometers.

8. An integrated circuit chip package according to claim 1 in which the die attach layer includes a spacer having a thickness defining a minimum thickness of the die attach layer.

9. An integrated circuit chip package according to claim 8 in which the spacer is a metal spacer having a radial shape.

* * * * *